United States Patent
Asayama

(10) Patent No.: US 11,013,120 B2
(45) Date of Patent: May 18, 2021

(54) TAPE WIRING BOARD AND SEMICONDUCTOR DEVICE

(71) Applicant: SHENZHEN TOREY MICROELECTRONIC TECHNOLOGY CO. LTD., Shenzhen (CN)

(72) Inventor: Nobuaki Asayama, Sakai (JP)

(73) Assignee: SHENZHEN TOREY MICROELECTRONIC TECHNOLOGY CO. LTD., Shenzhen (CN)

(*) Notice: Subject to any disclaimer, the term of this patent is extended or adjusted under 35 U.S.C. 154(b) by 0 days.

(21) Appl. No.: 16/399,105

(22) Filed: Apr. 30, 2019

(65) Prior Publication Data

US 2019/0380207 A1    Dec. 12, 2019

Related U.S. Application Data

(60) Provisional application No. 62/683,634, filed on Jun. 12, 2018.

(51) Int. Cl.
    *H01L 23/498*      (2006.01)
    *H05K 1/18*      (2006.01)
    *H05K 1/05*      (2006.01)

(52) U.S. Cl.
    CPC ........ *H05K 1/184* (2013.01); *H01L 23/49811* (2013.01); *H01L 23/49827* (2013.01); *H05K 1/05* (2013.01); *H05K 2201/10681* (2013.01)

(58) Field of Classification Search
CPC .... H05K 2201/10681; H01L 23/49811; H01L 23/49827
See application file for complete search history.

(56) References Cited

U.S. PATENT DOCUMENTS

| | | | |
|---|---|---|---|
| 6,018,188 A | 1/2000 | Yusa | |
| 7,253,503 B1 * | 8/2007 | Fusaro | H01L 23/3121 257/668 |
| 7,420,270 B2 | 9/2008 | Lee et al. | |
| 7,880,286 B2 | 2/2011 | Lee et al. | |
| 8,089,148 B1 * | 1/2012 | Lee | H01L 24/83 257/734 |

FOREIGN PATENT DOCUMENTS

| | | |
|---|---|---|
| JP | 2002-299567 A | 10/2002 |
| JP | 2007-027682 A | 2/2007 |

* cited by examiner

*Primary Examiner* — Dale E Page
*Assistant Examiner* — Wilner Jean Baptiste
(74) *Attorney, Agent, or Firm* — ScienBiziP, P.C.

(57) ABSTRACT

A tape wiring board includes an insulating film on which a semiconductor chip is mounted and metal layers formed on both principal surfaces, respectively, of the insulating film. That one of the metal layers which is formed on a first surface that is one principal surface of the insulating film and on which the semiconductor chip is mounted has a first electrode that is placed near substantially the center of a region on the first surface where the semiconductor chip is mounted.

13 Claims, 6 Drawing Sheets

TAPE WIRING BOARD AND SEMICONDUCTOR DEVICE

BACKGROUND OF THE INVENTION

Field of the Invention

The present invention relates to a tape wiring board having metal layers on both principal surfaces thereof and a semiconductor device.

Related Art

Recently, along with the growth of industries of flat displays such as LCDs (liquid crystal displays) for use in mobile phones, TFT LCDs (thin-film transistor LCDs) for use in computers, PDPs (plasma display panels) for home use, there have been growing industries of manufacture of tape packages that are drive chip components of flat display devices. Along with reductions in weight and thickness of display devices, these tape packages have been required to have wiring patterns with finer line spacing.

Note here that tape packages that are semiconductor devices using tape wiring boards include tape carrier packages (TCPs) and chip-on-film (COF) packages. A TCP has a structure in which a semiconductor chip is mounted by an inner lead bonding scheme on an inner lead exposed on a window of a tape wiring board. Meanwhile, a COF package has a structure in which a semiconductor chip is mounted by a flip-chip bonding scheme on a windowless tape wiring board. A COF package has such characteristics as to allow use of a thinner tape wiring board than a TCP and make it possible to design finer wiring patterns.

For example, a COF package is described in Japanese Unexamined Patent Application Publication No. 2007-27682. In the COF package described in Japanese Unexamined Patent Application Publication No. 2007-27682, a semiconductor chip is bonded to an upper surface of a tape wiring board, and a space between the semiconductor chip and the tape wiring board is filled with molding resin. The semiconductor chip has a row of electrode terminals arranged along each edge (chip edge) thereof. Further, the tape wiring board includes a film having vias vertically bored therethrough, an upper metal layer, formed on an upper surface of the film, that has input and output terminal patterns to which electrodes of the semiconductor chip are bonded and that extend out of a region where the semiconductor chip is mounted, and a lower metal layer, formed on a lower surface of the film, that has a ground layer.

Incidentally, in recent years, wiring patterns have been made finer and finer in pitch for increases in the numbers of inputs and outputs of semiconductor devices. However, there is a limit to wiring processing technologies and assembly technologies. Given these circumstances, as described in Japanese Unexamined Patent Application Publication No. 2007-27682, increases in the numbers of inputs and outputs are achieved by using both sides of a tape wiring board. For further increases in the numbers of inputs and outputs, a semiconductor chip has two rows of electrode terminals, for example, as described in Japanese Unexamined Patent Application Publication No. 2002-299567.

Incidentally, there has been a request for a reduction in price of semiconductor devices, and in particular, there has been a high demand for a reduction in price of semiconductor devices that are employed in products such as mobile phones. Note here that since the sizes of semiconductor chips affect the yields of these semiconductor chips per wafer, the sizes of semiconductor chips greatly affects the costs of semiconductor devices. In the wiring boards described in Japanese Unexamined Patent Application Publication No. 2007-27682 and Japanese Unexamined Patent Application Publication No. 2002-299567, electrodes that are connected to terminals of the semiconductor chips are formed along chip edges. This imposes restrictions on the sizes of the semiconductor chips and constitutes an obstacle to a reduction in price of semiconductor devices.

The present invention was made in view of the above circumstances. An object is to provide a tape wiring board that makes it possible to reduce the size of a semiconductor chip and can make a semiconductor device lower in price and a semiconductor device that can be made lower in price.

SUMMARY OF THE INVENTION (1) One embodiment of the present invention is directed to a tape wiring board including: an insulating film on which a semiconductor chip is mounted; and metal layers formed on both principal surfaces, respectively, of the insulating film, wherein that one of the metal layers which is formed on a first surface that is one principal surface of the insulating film and on which the semiconductor chip is mounted has a first electrode that is placed near substantially a center of a region on the first surface where the semiconductor chip is mounted.

(2) Further, in addition to the configuration of (1) described above, an embodiment of the present invention is directed to the tape wiring board, further including a via bored through the insulating film, wherein that one of the metal layers which is formed on a second surface that is the other principal surface of the insulating film has a back-surface wire, and the first electrode is connected to the back-surface wire via the via.

(3) Further, in addition to the configuration of (1) or (2) described above, an embodiment of the present invention is directed to the tape wiring board, wherein the metal layer that is formed on the first surface has a front-surface wire whose end is located near substantially the center of the region on the first surface where the semiconductor chip is mounted.

(4) Further, in addition to the configuration of (3) described above, an embodiment of the present invention is directed to the tape wiring board, wherein a plurality of the front-surface wires are arranged side by side in a predetermined direction, and the ends of adjacent ones of the front-surface wires are placed out of alignment with each other in a direction substantially perpendicular to the predetermined direction.

(5) Another embodiment of the present invention is directed to a semiconductor device including: a semiconductor chip; and an insulating film on which the semiconductor chip is mounted and on both principal surfaces of which metal layers are formed, respectively, wherein the semiconductor chip has a semiconductor connection terminal located near substantially a center of a surface of the semiconductor chip that faces the insulating film, and that one of the metal layers which is formed on a first surface that is one of the principal surfaces of the insulating film and on which the semiconductor chip is mounted has a first electrode, located near substantially a center of a region on the first surface where the semiconductor chip is mounted, that is connected to the semiconductor connection terminal.

(6) Further, in addition to the configuration of (5) described above, an embodiment of the present invention is directed to the semiconductor device, further including a via bored through the insulating film, wherein that one of the metal layers which is formed on a second surface that is the other of the principal surfaces of the insulating film has a back-surface wire, and the first electrode is connected to the back-surface wire via the via.

(7) Further, in addition to the configuration of (5) or (6) described above, an embodiment of the present invention is directed to the semiconductor device, wherein the metal layer that is formed on the first surface has a front-surface wire whose end is both located near substantially the center of the region on the first surface where the semiconductor chip is mounted and connected to the semiconductor connection terminal.

(8) Further, in addition to the configuration of (7) described above, an embodiment of the present invention is directed to the semiconductor device, wherein a plurality of the front-surface wires are arranged side by side in a predetermined direction, and the ends of adjacent ones of the front-surface wires are placed out of alignment with each other in a direction substantially perpendicular to the predetermined direction.

(9) Further, in addition to any one of the configurations (5) to (8) described above, an embodiment of the present invention is directed to the semiconductor device, wherein the semiconductor connection terminal is in contact with the first electrode and is placed within the first electrode.

(10) Further, in addition to any one of the configurations (5) to (8) described above, an embodiment of the present invention is directed to the semiconductor device, wherein the semiconductor connection terminal is placed so that a part of the semiconductor connection terminal makes contact with the first electrode.

The present invention makes it possible to reduce the size of a semiconductor chip and can make a semiconductor device lower in price.

DESCRIPTION OF PREFERRED EMBODIMENTS

The following describes embodiments of the present invention with reference to the drawings. The following description gives identical components identical signs. The same applies to their names and functions. Accordingly, a detailed description of them is not repeated. It should be noted that each drawing is a simplified schematic for understanding the present invention.

Embodiment 1

The following describes a first embodiment of the present invention with reference to the drawings.

Figure 1:
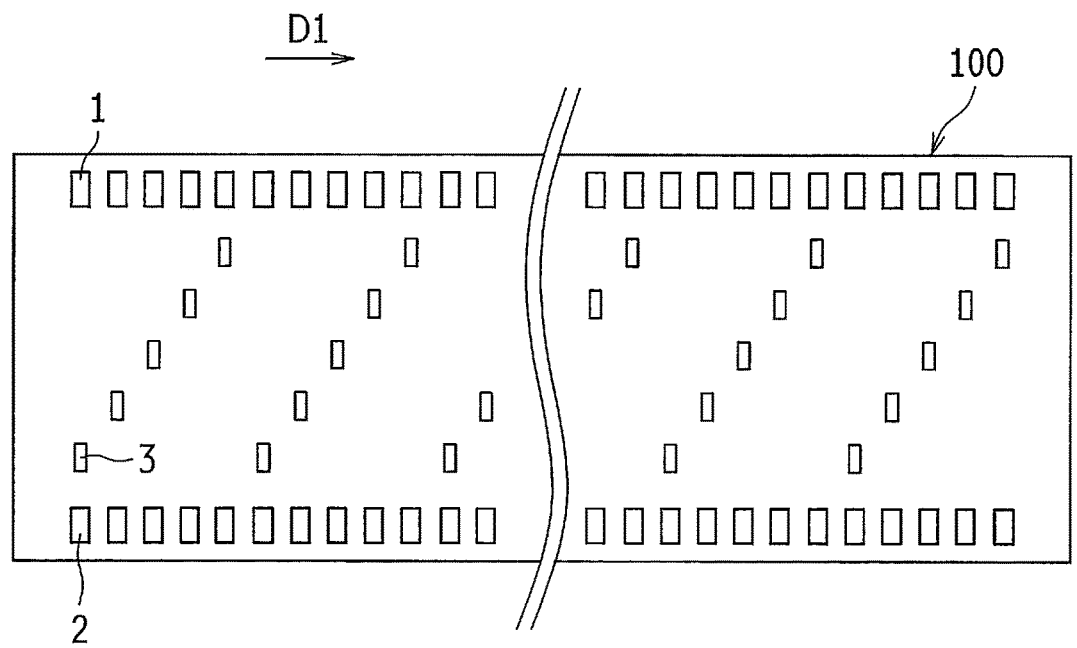
FIG. 1 is a schematic plan view of a semiconductor chip showing an arrangement of terminals according to a first embodiment of the present invention.
Figure 2:
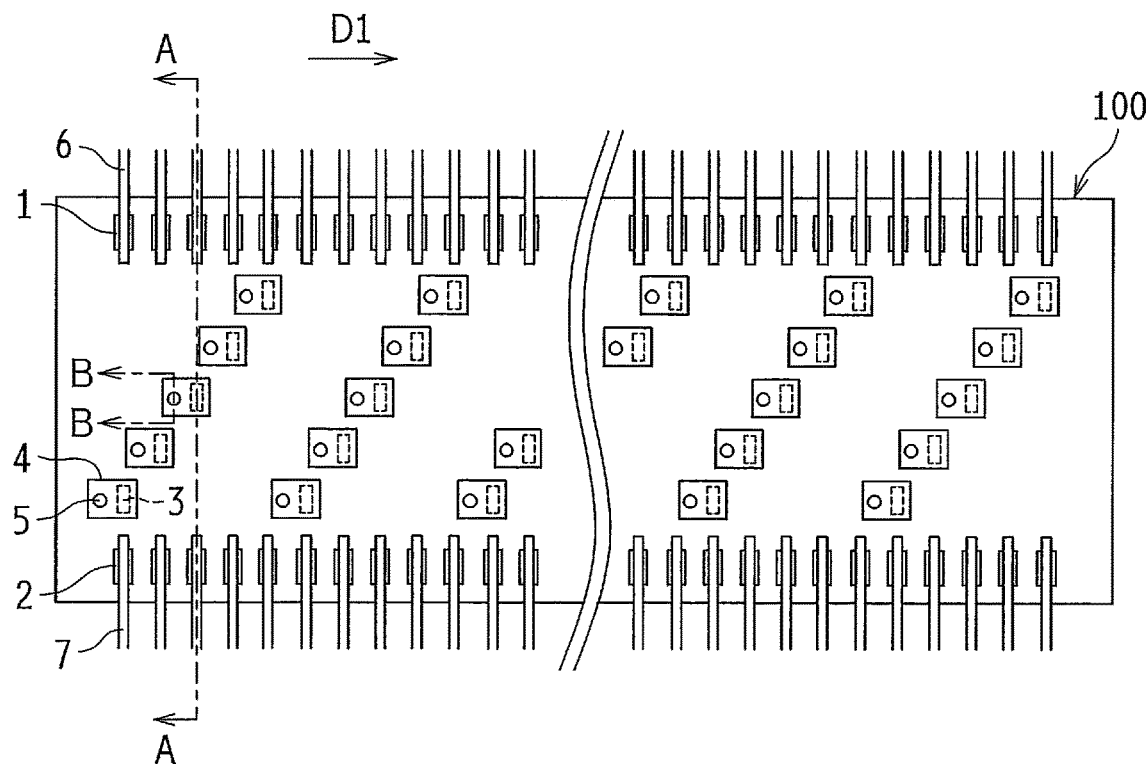
FIG. 2 is a schematic view showing wiring patterns on a surface of a tape wiring board according to the first embodiment of the present invention that faces the semiconductor chip.
Figure 3:
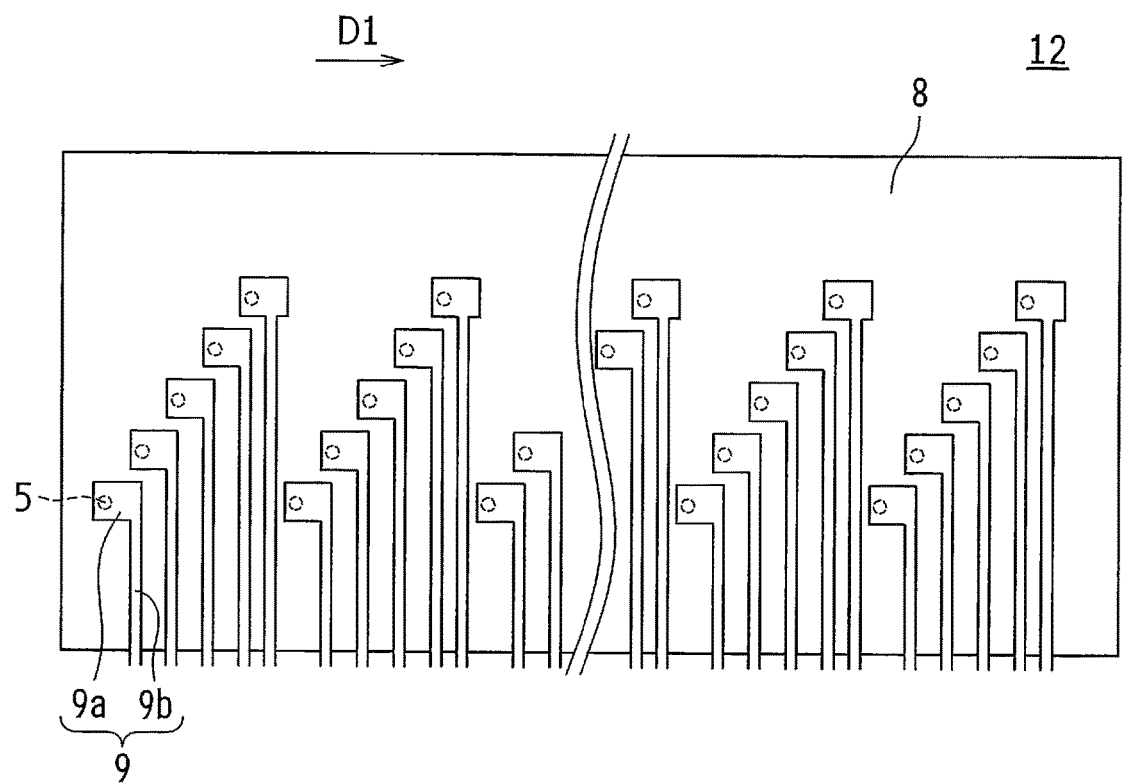
FIG. 3 is a schematic view showing wiring patterns on a surface of the tape wiring board according to the first embodiment of the present invention opposite to the semiconductor chip.
Figure 4:
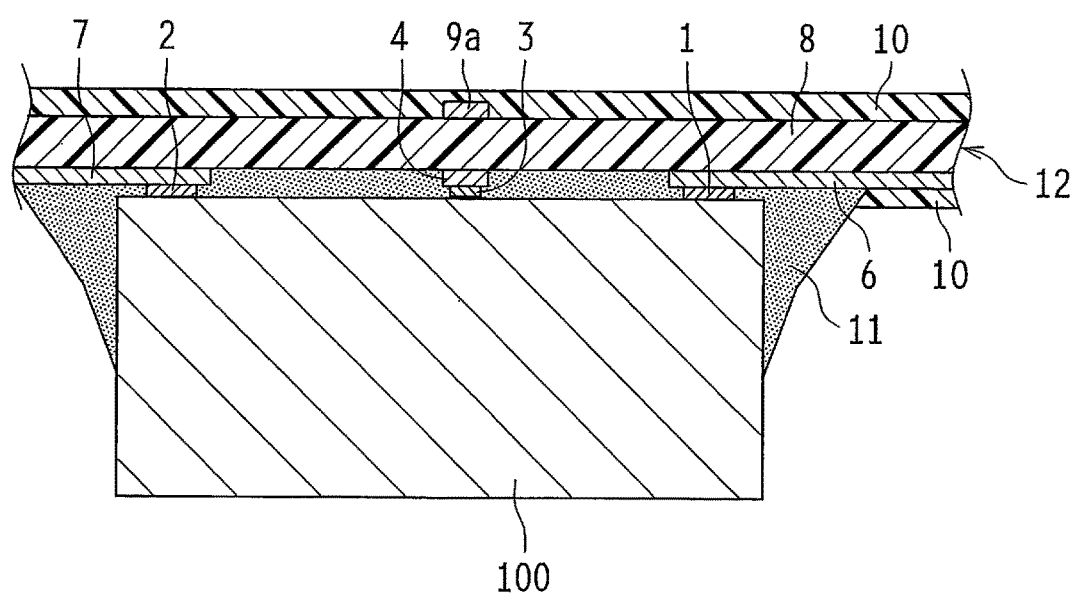
FIG. 4 is a schematic cross-sectional view showing a configuration of a semiconductor device according to the first embodiment of the present invention and a cross-sectional view of the semiconductor device in line A-A of FIG. 2.
Figure 5:
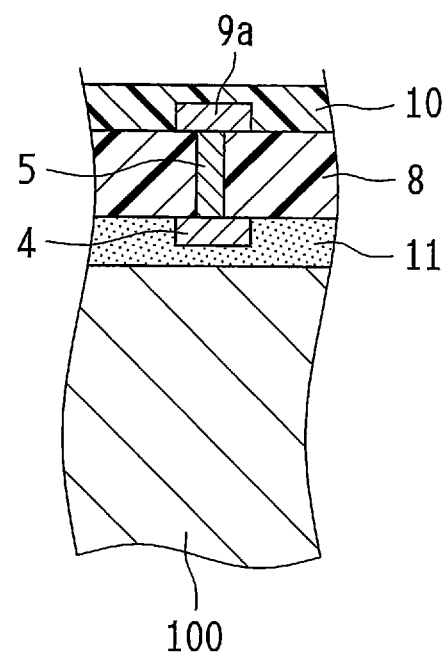
FIG. 5 is a schematic cross-sectional view showing the configuration of the semiconductor device according to the first embodiment of the present invention and a cross-sectional view of the semiconductor device in line B-B of FIG. 2.

FIG. 1 is a schematic plan view of a semiconductor chip 100 showing an arrangement of terminals according to the first embodiment of the present invention. FIG. 2 is a schematic view showing wiring patterns on a surface of a tape wiring board 12 according to the first embodiment of the present invention that faces the semiconductor chip 100. FIG. 3 is a schematic view showing wiring patterns on a surface of the tape wiring board 12 according to the first embodiment of the present invention opposite to the semiconductor chip 100. FIG. 4 is a schematic cross-sectional view showing a configuration of a semiconductor device 101 according to the first embodiment of the present invention and a cross-sectional view of the semiconductor device 101 in line A-A of FIG. 2. FIG. 5 is a schematic cross-sectional view showing the configuration of the semiconductor device 101 according to the first embodiment of the present invention and a cross-sectional view of the semiconductor device 101 in line B-B of FIG. 2.

Note here that FIG. 1 is a view of the semiconductor chip 100 from a side on which terminals are placed, i.e. a view of the semiconductor chip 100 from a surface on which first edge terminals 1, second edge terminals 2, and central terminals 3 are placed.

As shown in FIG. 1, the semiconductor chip 100 includes first edge terminals 1 arranged in a row along a chip edge that is an edge of the semiconductor chip 100, second edge terminals 2 arranged in a row along a chip edge placed opposite the chip edge along which the first edge terminals 1 are arranged, and central terminals 3 placed near a central part of the semiconductor chip 100 located between the first edge terminals 1 and the second edge terminals 2.

The first edge terminals 1 and the second edge terminals 2 are both arranged side by side with each other along a direction D1 that is a longitudinal direction of the semiconductor chip 100.

The central terminals 3 are arranged side by side along a direction diagonal to the chip edges between the first edge terminals 1 and the second edge terminals 2. That is, adjacent ones of the central terminals 3 are placed out of alignment with each other in a direction substantially perpendicular to the direction D1. Further, the central terminals 3 thus arranged side by side are arranged in a plurality of rows substantially parallel to one another. In this way, the central terminals 3 are placed not at the chip edges but near substantially the center of the semiconductor chip 100.

As shown in FIGS. 2 to 5, the semiconductor chip 100 is mounted on one principal surface of the tape wiring board 12. The tape wiring board 12 includes an insulating film 8, front-surface electrode pads 4, first front-surface wires 6, second front-surface wires 7, back-surface patterns 9, and vias 5.

It should be noted that the insulating film 8 has a first surface and a second surface that are principal surfaces, that a front surface of the insulating film 8 (tape wiring board 12) is a surface (first surface) on which the semiconductor chip 100 is mounted, and that a back surface of the insulating film 8 (tape wiring board 12) is a surface opposite to the front surface of the tape wiring board 12 and a surface (second surface) on which the semiconductor chip 100 is not mounted.

Further, FIG. 2 shows an arrangement of patterns, formed on a front-surface side of the tape wiring board 12, that are connected to the terminals of the semiconductor chip 100, and shows the semiconductor chip 100 and patterns, constituted by a metal layer, that are formed on the front surface of the tape wiring board 12. Note here that although the patterns that are formed on the front surface of the tape wiring board 12 include the front-surface electrode pads 4, the first front-surface wires 6, and the second front-surface wires 7, the vias 5, which are disposed to be bored through the insulating film 8, too are shown in FIG. 2.

As mentioned above, on the front surface of the insulating film 8, the front-surface electrode pads 4, the first front-surface wires 6, and the second front-surface wires 7 are formed, and on the back surface of the insulating film 8, the back-surface patterns 9, which are constituted by a metal layer, is formed. Further, the vias 5 are disposed to be bored through the insulating film 8, and the front-surface electrode pads 4 and the back-surface patterns 9 are connected by the vias 5. Further, the back-surface patterns 9 are each constituted by a back-surface electrode pad 9a and a back-surface wire 9b.

In particular, as shown in FIGS. 2 and 4, the first edge terminals 1 of the semiconductor chip 100 are connected to the first front-surface wires 6, the second edge terminals 2 of the semiconductor chip 100 are connected to the second front-surface wires 7, and the central terminals 3 of the semiconductor chip 100 are connected to the front-surface electrode pads 4. It should be noted that the central terminals 3 and the front-surface electrodes 4 are connected so that the central terminals 3 are entirely covered by the front-surface electrode pads 4.

As mentioned above, the vias 5 are bored through the insulating film 8 and connect the patterns formed on the front surface of the insulating film 8 and the patterns formed on the back surface of the insulating film 8. Specifically, the vias 5 are connected to the front-surface electrode pads 4 and the back-surface patterns 9, and the front-surface electrode pads 4 formed on the front surface of the insulating film 8 and the back-surface patterns 9 formed on the back surface of the insulating film 8 are connected via the vias 5.

In particular, as shown in FIG. 3, the vias 5 are connected to the back-surface electrode pads 9a of the back-surface patterns 9. It should be noted that each of the back-surface electrode pads 9a and the corresponding one of the back-surface wires 9b are combined, and constitute the corresponding one of the back-surface patterns 9.

In particular, as shown in FIG. 4, a space between the semiconductor chip 100 and the tape wiring board 12 is filled with molding resin 11. Further, a protective layer 10 is formed all over the back surface of the tape wiring board 12 and in places on the front surface of the tape wiring board 12 where the molding resin 11 is not formed.

With such a configuration, in the semiconductor device 101, the first edge terminals 1 are connected to the first front-surface wires 6 and drawn out of the tape wiring board 12. Further, the second edge terminals 2 are connected to the second front-surface wires 7 and drawn out of the tape wiring board 12.

The central terminals 3 are connected to the back-surface electrode pads 9a via the vias 5 from the front-surface electrode pads 4 and drawn by the back-surface wires 9b out of the tape wiring board 12.

Accordingly, the semiconductor device 101 is capable of the inputting and outputting of signals from and to the outside via the pluralities of first front-surface wires 6, second front-surface wires 7, and back-surface wires 9b. This makes it possible to increase the numbers of inputs and outputs of the semiconductor device 101.

The semiconductor chip 100 not only has its first and second edge terminals 1 and 2 at the chip edges thereof but also has its central terminals 3 placed near substantially the center thereof. This makes it possible to easily achieve a reduction in size without a decrease in the number of terminals in comparison with a semiconductor chip having terminals placed only at chip edges thereof. That is, the size of the semiconductor chip 100 can be reduced without a decrease in performance. Further, the semiconductor chip 100, which can be made smaller in size, can also be made lower in cost. This makes it possible to reduce the cost of the semiconductor device 101.

Further, since the front-surface electrode pads 4, the first front-surface wires 6, the second front-surface wires 7, the back-surface electrode pads 9a, and the back-surface wires 9b can be placed at sufficient intervals, a failure such as a short circuit between wires hardly occurs. Further, since the central terminals 3, the first edge terminals 1, and the second edge terminals 2, which are connected to the front-surface electrode pads 4, the first front-surface wires 6, and the second front-surface wires 7, respectively, too are formed at sufficient intervals on the semiconductor chip 100, the terminals do not make contact with one another and are therefore high in insulation reliability from one another.

In particular, since adjacent ones of the central terminals 3 are placed out of alignment with each other in a direction substantially perpendicular to the direction D1, the central terminals 3 are adjacent to each other at sufficient intervals and are high in insulation reliability. Further, as for the front-surface electrode pads 4, which are connected to the central terminals 3, too, adjacent ones of the front-surface electrode pads 4 are placed out of alignment with each other in a direction substantially perpendicular to the direction D1 as in the case of the central terminals 3, are formed at sufficient intervals, and hardly suffer from a failure such as a short circuit.

Further, since the first front-surface wires 6, the second front-surface wires 7, and the back-surface wires 9b are formed to each extend in a direction substantially perpendicular to a direction D1 and arranged substantially parallel to one another, the first front-surface wires 6, the second front-surface wires 7, and the back-surface wires 9b hardly suffer from a failure such as a short circuit.

Further, while the space between the semiconductor chip 100 and the tape wiring board 12 is filled with molding resin 11, the first front-surface wires 6 and the second front-surface wires 7 are formed to extend out of the semiconductor chip 100 from the chip edges of the semiconductor chip 100, and no wires are formed near substantially the center of the semiconductor chip 100, where the front-surface electrode pads 4 are formed. This brings about an effect of, during the filling of the molding resin 11, preventing a decline in fluidity of the molding resin 11 and making it harder for bubbles to be formed.

Embodiment 2

The following describes a second embodiment of the present invention with reference to the drawings.

Figure 6:
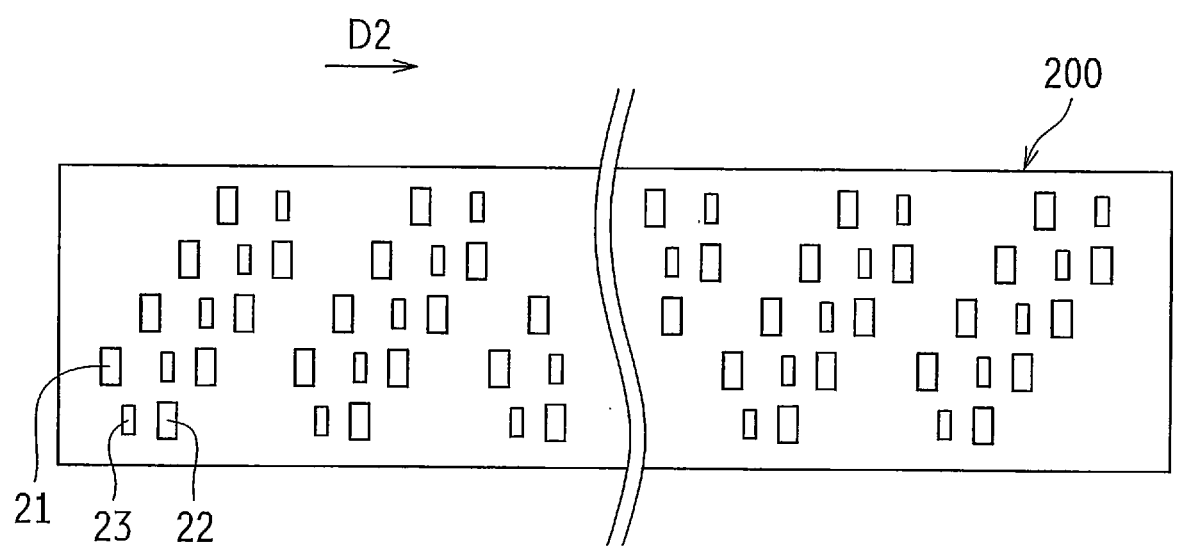
FIG. 6 is a schematic plan view of a semiconductor chip showing an arrangement of terminals according to a second embodiment of the present invention.
Figure 7:
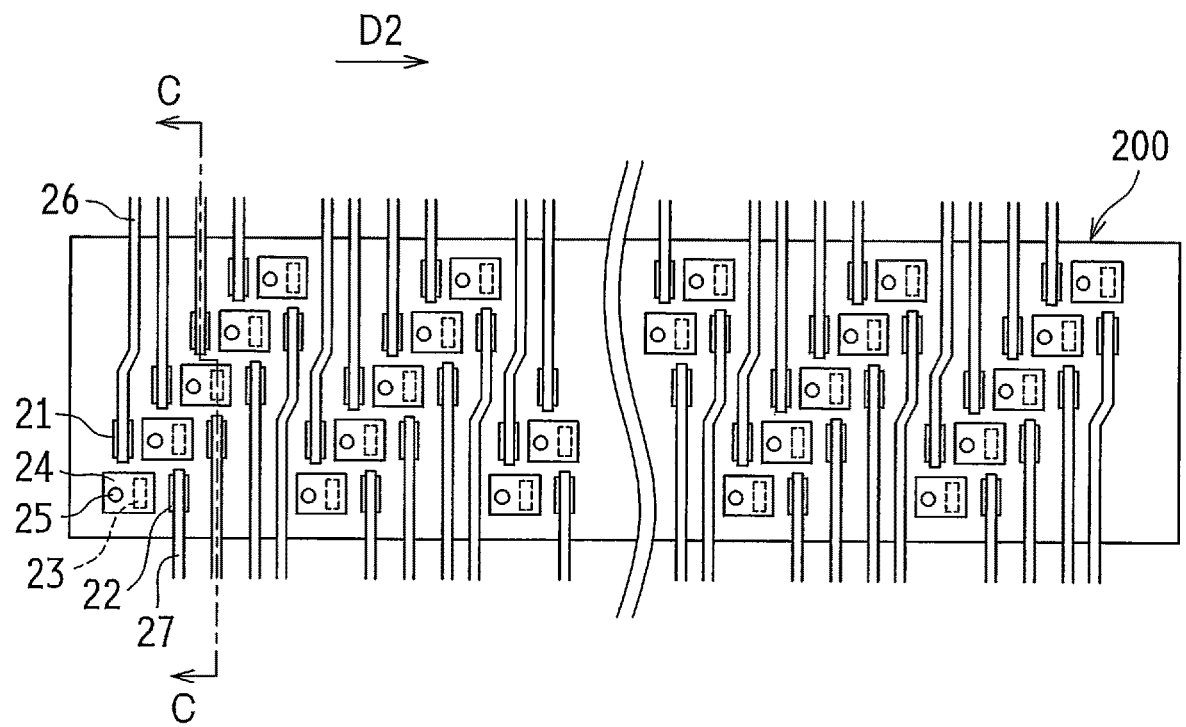
FIG. 7 is a schematic view showing wiring patterns on a surface of a tape wiring board according to the second embodiment of the present invention that faces the semiconductor chip.
Figure 8:
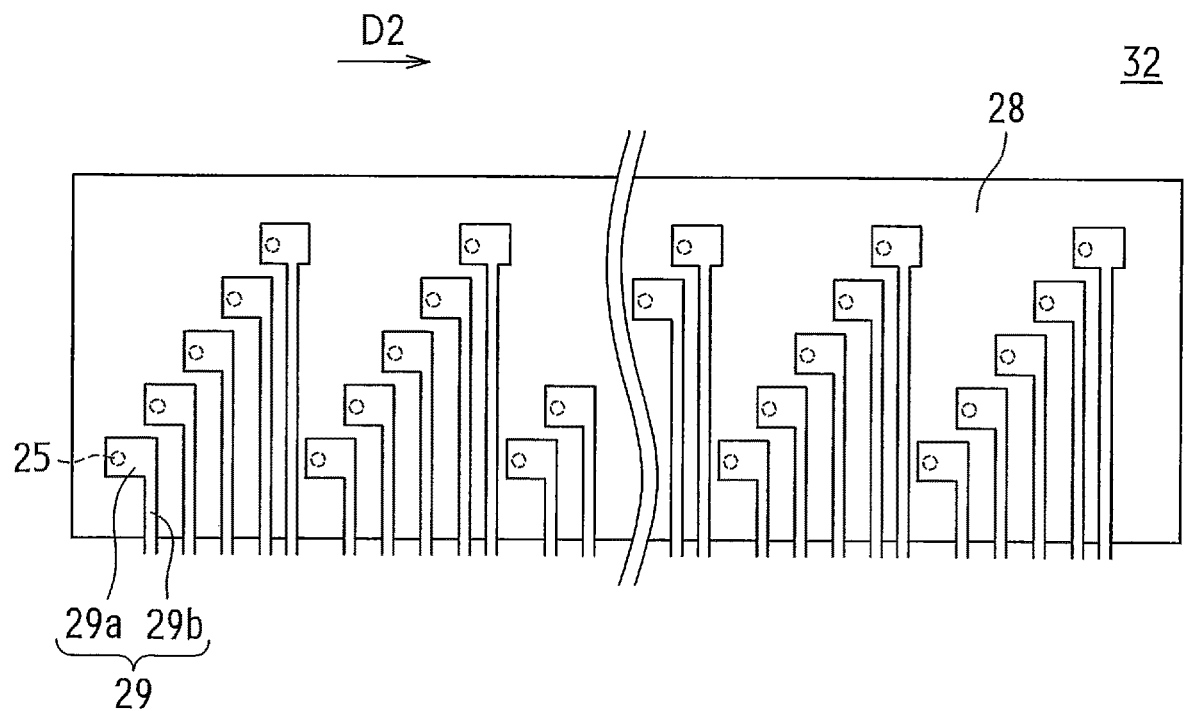
FIG. 8 is a schematic view showing wiring patterns on a surface of the tape wiring board according to the second embodiment of the present invention opposite to the semiconductor chip.
Figure 9:
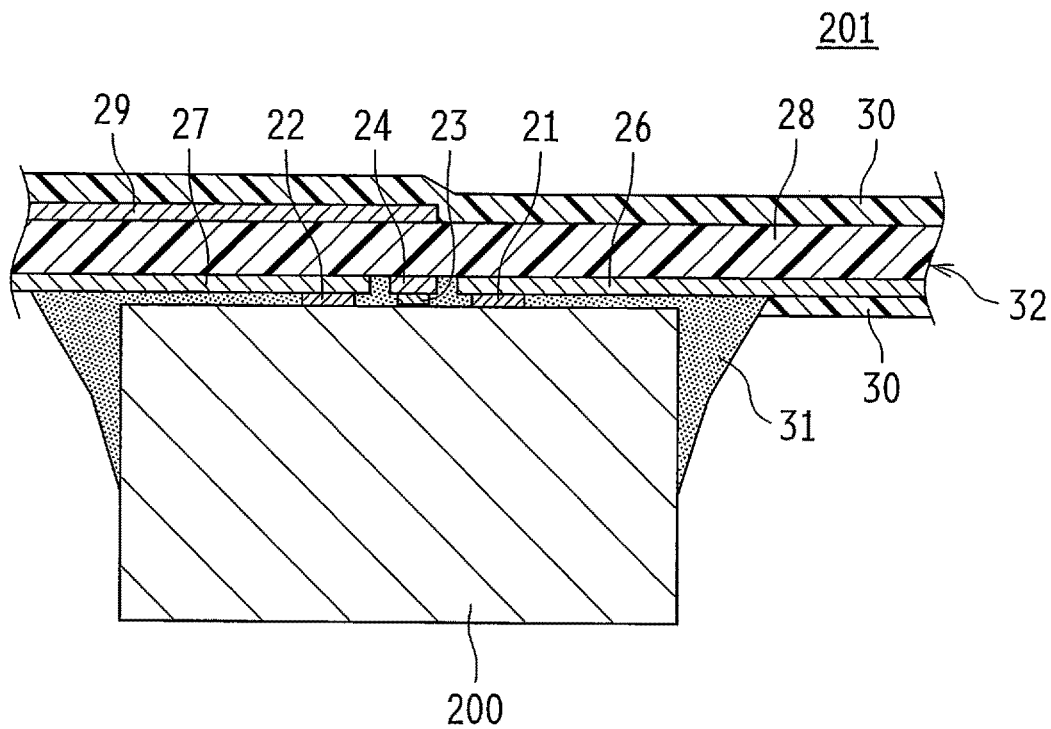
FIG. 9 is a schematic cross-sectional view showing a configuration of a semiconductor device according to the second embodiment of the present invention and a cross-sectional view of the semiconductor device in line C-C of FIG. 7.

FIG. 6 is a schematic plan view of a semiconductor chip 200 showing an arrangement of terminals according to a second embodiment of the present invention. FIG. 7 is a schematic view showing wiring patterns on a surface of a tape wiring board 32 according to the second embodiment of the present invention that faces the semiconductor chip 200. FIG. 8 is a schematic view showing wiring patterns on a surface of the tape wiring board 32 according to the second embodiment of the present invention opposite to the semiconductor chip 200. FIG. 9 is a schematic cross-sectional view showing a configuration of a semiconductor device 201 according to the second embodiment of the present invention and a cross-sectional view of the semiconductor device 201 in line C-C of FIG. 7.

Note here that FIG. 6 is a view of the semiconductor chip 200 from a side on which terminals are placed, i.e. a view of the semiconductor chip 200 from a surface on which first central terminals 21, second central terminals 22, and third central terminals 23 are placed.

As shown in FIG. 6, the semiconductor chip 200 has first central terminals 21, second central terminals 22, and third central terminals 23 that are arranged side by side along a direction diagonal to a direction D2 that is a longitudinal direction of the semiconductor chip 200 between chip edges opposed to each other. It should be noted that the direction D2 is a direction parallel to the chip edges.

Specifically, adjacent ones of the first central terminals 21 are placed out of alignment with each other in a direction substantially perpendicular to the direction D2. Further, the first central terminals 21 thus arranged side by side are arranged in a plurality of rows substantially parallel to one another.

Further, adjacent ones of the second central terminals 22 too are placed out of alignment with each other in a direction substantially perpendicular to the direction D2. Further, the second central terminals 22 thus arranged side by side are arranged in a plurality of rows substantially parallel to one another.

Further, adjacent ones of the third central terminals 23 too are placed out of alignment with each other in a direction substantially perpendicular to the direction D2. Further, the third central terminals 23 thus arranged side by side are arranged in a plurality of rows substantially parallel to one another.

The respective rows of the first central terminals 21, the second central terminals 22, and the third central terminals 23 arranged side by side along a direction diagonal to the direction D2 are arranged substantially parallel to one another, and the plurality of rows of the first central terminal 21, the plurality of rows of the third central terminals 23, and the plurality of rows of the second central terminals 22 are repeatedly arranged in this order along the direction D2. In this way, the first central terminals 21, the second central terminals 22, and the third central terminals 23 are placed near substantially the center of the semiconductor chip 200.

As shown in FIGS. 7 to 9, the semiconductor chip 200 is mounted on one principal surface of the tape wiring board 32. The tape wiring board 32 includes an insulating film 28, front-surface electrode pads 24, first front-surface wires 26, second front-surface wires 27, back-surface patterns 29, and vias 25.

It should be noted that the insulating film 28 has a first surface and a second surface that are principal surfaces, that a front surface of the insulating film 28 (tape wiring board 32) is a surface (first surface) on which the semiconductor chip 200 is mounted, and that a back surface of the insulating film 28 (tape wiring board 32) is a surface opposite to the front surface of the tape wiring board 32 and a surface (second surface) on which the semiconductor chip 200 is not mounted.

Further, FIG. 7 shows an arrangement of patterns, formed on a front-surface side of the tape wiring board 32, that are connected to the terminals of the semiconductor chip 200, and shows the semiconductor chip 200 and patterns, constituted by a metal layer, that are formed on the front surface of the tape wiring board 32. Note here that although the patterns that are formed on the front surface of the tape wiring board 32 include the front-surface electrode pads 24, the first front-surface wires 26, and the second front-surface wires 27, the vias 25, which are disposed to be bored through the insulating film 28, too are shown in FIG. 7.

As mentioned above, on the front surface of the insulating film 28, the front-surface electrode pads 24, the first front-surface wires 26, and the second front-surface wires 27 are formed, and on the back surface of the insulating film 28, the back-surface patterns 29, which are constituted by a metal layer, is formed. Further, the vias 25 are disposed to be bored through the insulating film 28, and the front-surface electrode pads 24 and the back-surface patterns 29 are connected by the vias 25. Further, the back-surface patterns 29 are each constituted by a back-surface electrode pad 29a and a back-surface wire 29b.

In particular, as shown in FIGS. 7 and 9, the first central terminals 21 of the semiconductor chip 200 are connected to the first front-surface wires 26, and the second central terminals 22 of the semiconductor chip 200 are connected to the second front-surface wires 27. It should be noted that ends of the first front-surface wires 26 are connected to the first central terminals 21, and ends of the second front-surface wires 27 are connected to the second central terminals 22.

Further, the third central terminals 23 of the semiconductor chip 100 are connected to the front-surface electrode pads 24. It should be noted that the third central terminals 23 and the front-surface electrodes 24 are connected so that the third central terminals 23 are entirely covered by the front-surface electrode pads 24.

As mentioned above, the vias 25 are bored through the insulating film 28 and connect the patterns formed on the front surface of the insulating film 28 and the patterns formed on the back surface of the insulating film 28. Specifically, the vias 25 are connected to the front-surface electrode pads 24 and the back-surface patterns 29, and the front-surface electrode pads 24 formed on the front surface of the insulating film 28 and the back-surface patterns 29 formed on the back surface of the insulating film 28 are connected via the vias 25.

In particular, as shown in FIG. 8, the vias 25 are connected to the back-surface electrode pads 29a of the back-surface patterns 29. It should be noted that each of the back-surface electrode pads 29a and the corresponding one of the back-surface wires 29b are combined, and constitute the corresponding one of the back-surface patterns 29.

In particular, as shown in FIG. 9, a space between the semiconductor chip 200 and the tape wiring board 32 is filled with molding resin 31. Further, a protective layer 30 is formed all over the back surface of the tape wiring board 32 and in places on the front surface of the tape wiring board 32 where the molding resin 31 is not formed.

With such a configuration, in the semiconductor device 201, the first central terminals 21 are connected to the first front-surface wires 26 and drawn out of the tape wiring board 32. Further, the second central terminals 22 are connected to the second front-surface wires 27 and drawn out of the tape wiring board 32.

The third central terminals 23 are connected to the back-surface electrode pads 29a via the vias 25 from the front-surface electrode pads 24 and drawn by the back-surface wires 29b out of the tape wiring board 32.

Accordingly, the semiconductor device 201 is capable of the inputting and outputting of signals from and to the outside via the pluralities of first front-surface wires 26, second front-surface wires 27, and back-surface wires 29b. This makes it possible to increase the numbers of inputs and outputs of the semiconductor device 201.

The semiconductor chip 200 has its first, second, and third central terminals 21, 22, and 23 placed near substantially the center thereof. This makes it possible to easily achieve a reduction in size without a decrease in the number of terminals. That is, the size of the semiconductor chip 200 can be reduced without a decrease in performance. Further, the semiconductor chip 200, which can be made smaller in size, can also be made lower in cost. This makes it possible to reduce the cost of the semiconductor device 201.

Further, since the front-surface electrode pads 24, the first front-surface wires 26, the second front-surface wires 27, the back-surface electrode pads 29a, and the back-surface wires 29b can be placed at sufficient intervals, a failure such as a short circuit between wires hardly occurs. Further, since the third central terminals 23, the first central terminals 21, and the second central terminals 22, which are connected to the front-surface electrode pads 24, the first front-surface wires 26, and the second front-surface wires 27, respectively, too are formed at sufficient intervals on the semiconductor chip 200, the terminals do not make contact with one another and are therefore high in insulation reliability from one another.

Specifically, since adjacent ones of the first central terminals 21 are placed out of alignment with each other in a direction substantially perpendicular to the direction D2, the first central terminals 21 are adjacent to each other at sufficient intervals and are high in insulation reliability. Further, as in the case of the first central terminals 21, ends of adjacent ones of the first front-surface wires 26 are formed at sufficient intervals from each other and hardly suffer from a failure such as a short circuit.

Further, since adjacent ones of the second central terminals 22 too are placed out of alignment with each other in a direction substantially perpendicular to the direction D2, the second central terminals 22 are adjacent to each other at sufficient intervals and are high in insulation reliability. Further, as in the case of the second central terminals 22, ends of adjacent ones of the second front-surface wires 27 are formed at sufficient intervals from each other and hardly suffer from a failure such as a short circuit.

Further, since adjacent ones of the third central terminals 23 are placed out of alignment with each other in a direction substantially perpendicular to the direction D2, the third central terminals 23 are adjacent to each other at sufficient intervals and are high in insulation reliability. Further, as for the front-surface electrode pads 24, which are connected to the third central terminals 23, too, adjacent ones of the front-surface electrode pads 24 are formed at sufficient intervals from each other as in the case of the third central terminals 23 and hardly suffer from a failure such as a short circuit.

Further, since the first front-surface wires 26, the second front-surface wires 27, and the back-surface wires 29b are formed to each extend in a direction substantially perpendicular to the direction D2 and arranged substantially parallel to one another, the first front-surface wires 26, the second front-surface wires 27, and the back-surface wires 29b hardly suffer from a failure such as a short circuit.

Embodiment 3

The following describes a third embodiment of the present invention with reference to the drawings.

Figure 10:
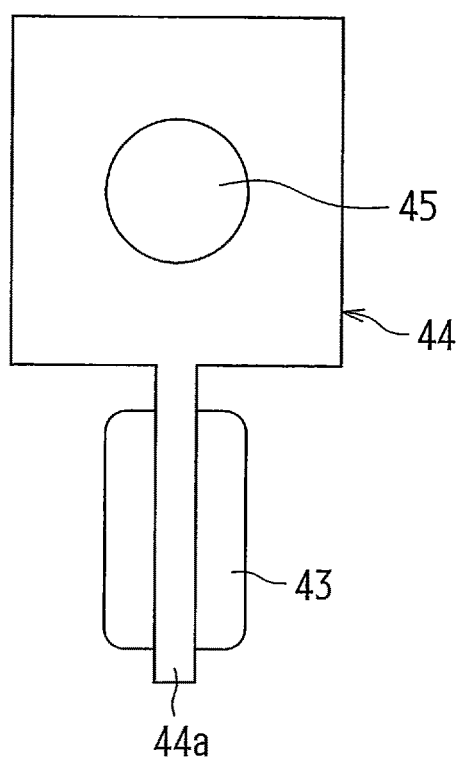
FIG. 10 is a schematic view showing a configuration of an electrode that is connected to a terminal of a semiconductor chip of a tape wiring board according to a third embodiment of the present invention.

FIG. 10 is a schematic view showing a configuration of an electrode that is connected to a terminal of a semiconductor chip of a tape wiring board according to a third embodiment of the present invention. It should be noted that a semiconductor device according to the third embodiment differs in the shape of a front-surface electrode pad from the semiconductor device 101 according to the first embodiment and the semiconductor device 201 according to the second embodiment and, in other respects, is substantially identical in configuration to the semiconductor devices 101 and 201. Therefore, only a description of this point of difference is given with an omission of other descriptions.

As shown in FIG. 10, a front-surface electrode pad 44 according to the third embodiment is shaped to have a projecting part 44a, and is connected to a via 45. This projecting part 44a and a central terminal 43 of the semiconductor chip are connected. Note here that not all of the central terminal 43 is connected to the projecting part 44a, but only a part of the central terminal 43 is connected to the projecting part 44a. That is, the central terminal 43 is configured such that not all but only a part of the central terminal 43 is covered by the projecting part 44a.

With such a configuration in which not the whole surface but only a part of the central terminal 43 is connected to the front-surface electrode pad 44 (projecting part 44a), an area of contact between the front-surface electrode pad 44 and the central terminal 43 becomes comparatively smaller. This makes it possible to reduce damage to the semiconductor chip in bonding together the central terminal 43 and the front-surface electrode pad 44 at the time of manufacture of the semiconductor device.

Embodiment 4

The following describes a fourth embodiment of the present invention with reference to the drawings.

Figure 11:
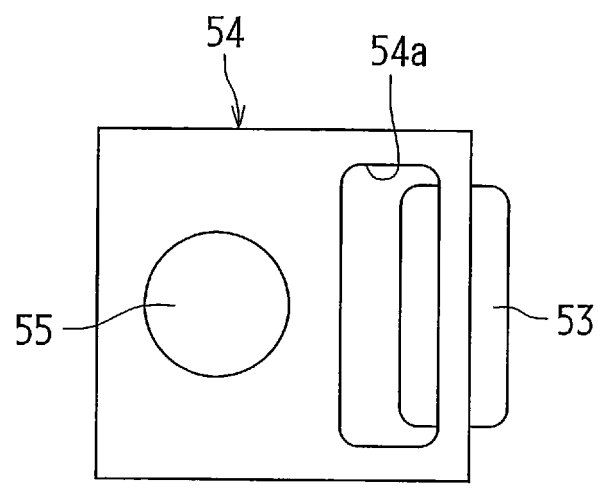
FIG. 11 is a schematic view showing a configuration of an electrode that is connected to a terminal of a semiconductor chip of a tape wiring board according to a fourth embodiment of the present invention.

FIG. 11 is a schematic view showing a configuration of an electrode that is connected to a terminal of a semiconductor chip of a tape wiring board according to a fourth embodiment of the present invention. It should be noted that a semiconductor device according to the fourth embodiment differs in the shape of a front-surface electrode pad from the semiconductor device 101 according to the first embodiment and the semiconductor device 201 according to the second embodiment and, in other respects, is substantially identical in configuration to the semiconductor devices 101 and 201. Therefore, only a description of this point of difference is given with an omission of other descriptions.

As shown in FIG. 11, a front-surface electrode pad 54 according to the fourth embodiment is shaped to be formed with a hole 54a, and is connected to a via 55. The front-surface electrode pad 54 and a central terminal 53 are connected so that a part of the central terminal 53 of the semiconductor chip overlaps the hole 54a.

With this, not all of the central terminal 53 is connected to the front-surface electrode pad 54, but only a part of the central terminal 53 is connected to the front-surface electrode pad 54. That is, the central terminal 53 is configured such that not all but only a part of the central terminal 53 is covered by the front-surface electrode pad 54.

With such a configuration in which not the whole surface but only a part of the central terminal 53 is connected to the front-surface electrode pad 54, an area of contact between the front-surface electrode pad 54 and the central terminal 53 becomes comparatively smaller. This makes it possible to reduce damage to the semiconductor chip in bonding together the central terminal 53 and the front-surface electrode pad 54 at the time of manufacture of the semiconductor device.

It should be noted that the shapes of the front-surface electrode pads 44 and 54 illustrated by the third embodiment and the fourth embodiment, respectively, are not limited to these shapes. An electrode pad that is connected to a terminal of a semiconductor chip needs only be shaped to cover not the whole surface but only a part of the terminal of the semiconductor chip.

The present invention is not limited to the embodiments described above but may be carried out in other various forms. For that reason, the embodiments are mere examples in all respects and should not be narrowly interpreted. The scope of the present invention is indicated by the scope of the claims and is by no means bound by the body of the specification. Furthermore, all modifications and alterations belonging to the scope of equivalents of the scope of the claims fall within the scope of the present invention.

The invention claimed is:

1. A tape wiring board comprising:
an insulating film on which a semiconductor chip is mounted; and
a plurality of metal layers, each of which is formed on a first surface that is one principal surface of the insulating film and on which the semiconductor chip is mounted, having a plurality of first electrodes, each of which is placed near substantially a center of a region on the first surface where the semiconductor chip is mounted,
wherein the plurality of metal layers include a plurality of front-surface wires,
wherein the plurality of first electrodes are arranged side by side in a direction substantially diagonal to a direction along which the plurality of the front-surface wires extend.

2. The tape wiring board according to claim 1, further comprising a plurality of vias, each of which is bored through the insulating film, and
another plurality of metal layers, each of which is formed on a second surface that is the other principal surface of the insulating film, having a plurality of back-surface wires, respectively,
wherein the plurality of first electrodes are connected to the plurality of back-surface wires via the plurality of vias, respectively.

3. The tape wiring board according to claim 1, wherein a plurality of ends of the plurality of front-surface wires are located near substantially the center of the region on the first surface where the semiconductor chip is mounted.

4. The tape wiring board according to claim 1, wherein the plurality of front-surface wires are arranged side by side in a predetermined direction, and
the ends of adjacent ones of the plurality of front-surface wires are placed out of alignment with each other in a direction substantially perpendicular to the predetermined direction.

5. The tape wiring board according to claim 1, wherein the plurality of front-surface wires comprise
three or more front-surface wires that are arranged side by side in a predetermined direction, and
adjacent ones of the ends of the plurality of front-surface wires are placed out of alignment with each other in a direction substantially perpendicular to the predetermined direction.

6. A semiconductor device comprising:
a semiconductor chip; and
an insulating film on which the semiconductor chip is mounted,
wherein the semiconductor chip has a plurality of semiconductor connection terminals located near substantially a center of a surface of the semiconductor chip that faces the insulating film,
the semiconductor device further comprises a tape wiring board including a plurality of metal layers formed on a first surface that is one principal surface of the insulating film and on which the semiconductor chip is the plurality of metal layers including a plurality of first electrodes that are located near substantially a center of a region on the first surface where the semiconductor chip is mounted is the plurality of first electrodes respectively connected to the plurality of semiconductor connection terminals,
wherein the plurality of metal layers include a plurality of front-surface wires,
wherein the plurality of first electrodes are arranged side by side in a direction substantially diagonal to a direction along which the plurality of the front-surface wires extend.

7. The semiconductor device according to claim 6, further comprising a plurality of vias, each of which is bored through the insulating film, and
another plurality of metal layers, each of which is formed on a second surface that is the other principal surface of the insulating film, having a plurality of back-surface wires, respectively,
wherein the plurality of first electrodes are connected to the plurality of back-surface wires the plurality of vias, respectively.

8. The semiconductor device according to claim 7, wherein a plurality of ends of the plurality of front-surface wires are located near substantially the center of the region on the first surface where the semiconductor chip is mounted.

9. The semiconductor device according to claim 6, wherein a plurality of ends of the plurality of front-surface wires are located near substantially the center of the region on the first surface where the semiconductor chip is mounted.

10. The semiconductor device according to claim 6, wherein the plurality of front-surface wires are arranged side by side in a predetermined direction, and
the ends of adjacent ones of the plurality of front-surface wires are placed out of alignment with each other in a direction substantially perpendicular to the predetermined direction.

11. The semiconductor device according to claim 6, wherein the plurality of semiconductor connection terminals are in contact with the plurality of first electrodes, respectively, and are placed within the plurality of first electrodes, respectively.

12. The semiconductor device according to claim 6, wherein the plurality of semiconductor connection terminals are placed so that parts of the plurality of semiconductor connection terminals make contact with the plurality of first electrodes, respectively.

13. The semiconductor device according to claim 6, wherein the plurality of front-surface wires comprise
three or more front-surface wires that are arranged side by side in a predetermined direction, and
adjacent ones of the ends of the plurality of front-surface wires are placed out of alignment with each other in a direction substantially perpendicular to the predetermined direction.

* * * * *